United States Patent
Topacio (10) Patent No.: US 9,728,518 B2
(45) Date of Patent: Aug. 8, 2017

(54) INTERCONNECT ETCH WITH POLYMER LAYER EDGE PROTECTION

(71) Applicant: Roden R. Topacio, Markham (CA)

(72) Inventor: Roden R. Topacio, Markham (CA)

(73) Assignee: ATI Technologies ULC, Markham (CA)

( * ) Notice: Subject to any disclaimer, the term of this patent is extended or adjusted under 35 U.S.C. 154(b) by 452 days.

(21) Appl. No.: 14/231,997

(22) Filed: Apr. 1, 2014

(65) Prior Publication Data

US 2015/0279728 A1   Oct. 1, 2015

(51) Int. Cl.
*H01L 23/00* (2006.01)
*H01L 21/78* (2006.01)
*H01L 21/311* (2006.01)

(52) U.S. Cl.
CPC ........ *H01L 24/11* (2013.01); *H01L 21/31144* (2013.01); *H01L 21/78* (2013.01); *H01L 24/03* (2013.01); *H01L 24/05* (2013.01); *H01L 24/13* (2013.01); *H01L 2224/0345* (2013.01); *H01L 2224/0346* (2013.01); *H01L 2224/05155* (2013.01); *H01L 2224/05572* (2013.01); *H01L 2224/05583* (2013.01); *H01L 2224/05647* (2013.01); *H01L 2224/05655* (2013.01); *H01L 2224/119* (2013.01); *H01L 2224/1146* (2013.01); *H01L 2224/131* (2013.01); *H01L 2224/13147* (2013.01); *H01L 2224/94* (2013.01); *H01L 2924/12042* (2013.01)

(58) Field of Classification Search
CPC .................................................. H01L 2924/00
USPC ........................................................ 438/462
See application file for complete search history.

(56) References Cited

U.S. PATENT DOCUMENTS

| | | | |
|---|---|---|---|
| 6,117,299 A | * | 9/2000 | Rinne ..................... H01L 24/03 205/123 |
| 6,455,920 B2 | | 9/2002 | Fukasawa et al. |
| 6,638,691 B2 | | 10/2003 | Kang et al. |
| 7,052,975 B2 | | 5/2006 | Koizumi |
| 7,214,568 B2 | | 5/2007 | Brennan et al. |
| 7,301,222 B1 | | 11/2007 | Patwardhan et al. |
| 7,638,858 B2 | | 12/2009 | Kurosawa et al. |
| 7,687,919 B2 | | 3/2010 | Park |
| 7,776,720 B2 | | 8/2010 | Boyle et al. |
| 8,723,314 B2 | | 5/2014 | Su et al. |

(Continued)

FOREIGN PATENT DOCUMENTS

JP   2009-105211 A   5/2009

OTHER PUBLICATIONS

DISCO Corporation; *Laser Application-7000 Series*; www.discousa.com/eg/products/catalog/pdf/dfl7000.pdf, Dec. 2, 2009; pp. 1-8.

*Primary Examiner* — Mohammad Choudhry
(74) *Attorney, Agent, or Firm* — Timothy M. Honeycutt (57) ABSTRACT

Various semiconductor workpiece polymer layers and methods of fabricating the same are disclosed. In one aspect, a method of manufacturing is provided that includes applying a polymer layer to a passivation structure of a semiconductor workpiece where the semiconductor workpiece has first and second semiconductor chips separated by a dicing street. A first opening is patterned in the polymer layer with opposing edges pulled back from the dicing street. A mask is applied over the first opening. A first portion of the passivation structure is etched while using the polymer layer as an etch mask.

19 Claims, 9 Drawing Sheets

(56) References Cited

U.S. PATENT DOCUMENTS

| | | | |
|---|---|---|---|
| 9,165,832 B1 * | 10/2015 | Papanu | H01L 21/78 |
| 2003/0038343 A1 | 2/2003 | Hasegawa | |
| 2004/0043614 A1 | 3/2004 | Koizumi | |
| 2005/0029628 A1 | 2/2005 | Kurosawa | |
| 2005/0056871 A1 | 3/2005 | Taar et al. | |
| 2007/0108621 A1 | 5/2007 | Park | |
| 2007/0119892 A1 | 5/2007 | Horsfield | |
| 2007/0182004 A1 * | 8/2007 | Rinne | H01L 23/3114 257/734 |
| 2007/0187802 A1 | 8/2007 | Kurosawa et al. | |
| 2008/0012095 A1 | 1/2008 | Lee et al. | |
| 2008/0012096 A1 | 1/2008 | Sin et al. | |
| 2008/0150087 A1 | 6/2008 | Farooq et al. | |
| 2009/0057838 A1 | 3/2009 | Arita et al. | |
| 2009/0079038 A1 | 3/2009 | Schneegans et al. | |
| 2009/0098712 A1 | 4/2009 | Taguchi et al. | |
| 2009/0152683 A1 | 6/2009 | Nguyen et al. | |
| 2009/0166810 A1 | 7/2009 | Stillman et al. | |
| 2009/0302427 A1 | 12/2009 | Su et al. | |
| 2010/0019354 A1 | 1/2010 | Farooq et al. | |
| 2011/0031591 A1 | 2/2011 | Min et al. | |
| 2011/0147895 A1 | 6/2011 | Bai et al. | |
| 2011/0227201 A1 | 9/2011 | Too et al. | |

* cited by examiner

INTERCONNECT ETCH WITH POLYMER LAYER EDGE PROTECTION

BACKGROUND OF THE INVENTION

1. Field of the Invention

This invention relates generally to semiconductor processing, and more particularly to polymer layers for semiconductor workpieces and methods of patterning the same.

2. Description of the Related Art

Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. Many conventional semiconductor dice have four sides and four corners. The dicing operation is a mechanical cutting operation performed with a type of circular saw. Dicing saws are made with great care and operate more precisely than a comparable masonry circular saw.

In some conventional semiconductor wafer fabrication processes, the individual chips are bumped prior to singulation from the wafer. In some conventional designs, this entails patterning a top polyimide layer that is used for stress relief with openings positioned at intended bump locations and openings that track the locations of the dicing streets of the wafer. In some conventional processes, the polyimide film is used as an etch mask against a passivation structure etch that is necessary to create openings down to underlying top metallization pads. Using the polyimide film as the etch mask provides for more accurate alignment of bumps to underlying pads. However, the polyimide film must cover the entire chip prior to the passivation etch. If not, areas of the chips, such as exposed metallization, may be attacked by the etch in areas where there is no polyimide or passivation present. To achieve this necessary global polyimide coverage, the polyimide openings proximate the dicing streets are made very close and preferably in vertical alignment with the underlying edges of the dicing street. Since certain conventional dicing processes employ a two-step process that involves a first laser trench cutting process followed by a mechanical sawing process, the close proximity of the polyimide dicing street opening edges to the dicing street edges can create the risk of thermal damage or burning of the polyimide film during the laser cutting operation. This can lead to a host of problems, such as a device failure and yield issues. Some conventional processes provide for polyimide edge pull back from dicing street edges. However, those processes do not utilize the polyimide film as an etch mask for a passivation structure etch.

One conventional solution to the aforementioned problems is to enlarge the width of dicing streets on a semiconductor wafer. However, this will typically result in a lower gross die per wafer since wider dicing streets take up additional wafer space. Another conventional solution is to use a two-step process that involves first masking the passivation layer and etching the openings in the passivation layer followed by a polyimide coating process and exposure and development. However, this conventional process cannot provide the same accurate alignment between subsequent bumps and the underlying conductor pads.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes applying a polymer layer to a passivation structure of a semiconductor workpiece where the semiconductor workpiece has first and second semiconductor chips separated by a dicing street. A first opening is patterned in the polymer layer with opposing edges pulled back from the dicing street. A mask is applied over the first opening. A first portion of the passivation structure is etched while using the polymer layer as an etch mask.

In accordance with another aspect of an embodiment of the present invention, a method of manufacturing is provided that includes applying a polyimide layer to a passivation structure of a silicon wafer where the silicon wafer has first and second semiconductor chips separated by a dicing street. A first opening is patterned in the polymer layer with opposing edges pulled back from the dicing street and a second opening is patterned in the polymer layer exposing a first portion of the passivation structure. A mask is applied over the first opening. The first portion of the passivation structure is etched to expose an underlying portion of the silicon wafer while using the polymer layer as an etch mask.

In accordance with another aspect of an embodiment of the present invention, a semiconductor workpiece is provided that includes first and second semiconductor chips separated by a dicing street, a passivation structure over the first and second semiconductor chips, and a polymer layer on the passivation structure. The polymer layer has a first opening with opposing edges pulled back from the dicing street. A mask is over the first opening.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

A method of manufacturing includes applying a polymer layer, such as polyimide, to a passivation structure of a semiconductor workpiece, such as a silicon wafer. The semiconductor workpiece includes first and second semiconductor chips separated by a dicing street. A first opening is patterned in the polymer layer with opposing edges pulled back from the dicing street. A mask is applied over the first opening. A first portion of the passivation structure is etched while using the polymer layer an etch mask. A laser trenching and mechanical sawing are later conducted at the dicing street. The edge pullback of the polymer layer reduces the risk of thermal damage during the laser trenching operation but still allows the polymer layer to serve as an etch mask. Additional details will now be disclosed.

Figure 1:
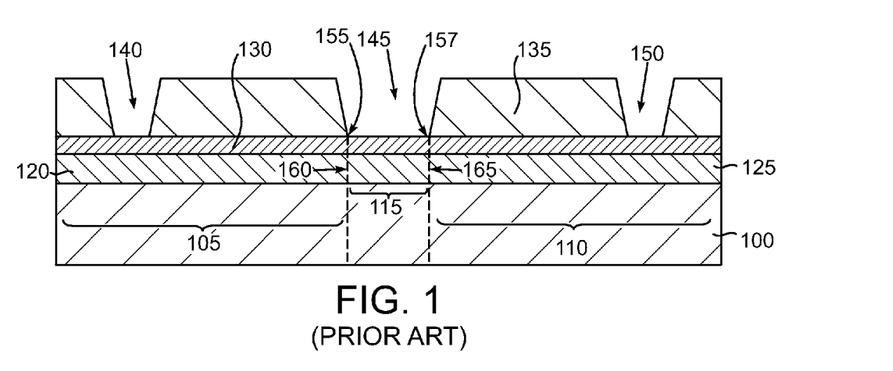
FIG. 1 is a sectional view of a small portion of a conventional silicon wafer.

In the drawings described below, reference numerals are generally repeated where identical elements appear in more than one figure. Turning now to the drawings, and in particular to FIG. 1, therein is shown a sectional view of a small portion of a conventional silicon wafer 100. The wafer 100 includes multiple semiconductor dice or chips, two of which are partially depicted and labeled 105 and 110, respectively. The chips 105 and 110 are divided spatially by one or more dicing streets, one of which is visible and labeled 115. The chips 105 and 110 include respective circuit layers, which are schematically represented and labeled 120 and 125, respectively. The circuit layers 120 and 125 include not only active circuitry but also plural metallization and interlevel dielectric layers stacked upon one another. A passivation structure 130 overlays the circuit structures 120 and 125 and consists of a laminate of silicon dioxide and silicon nitride layers. A polyimide film 135 is formed on the passivation structure 130 and patterned lithographically to have openings 140, 145 and 150. The openings 140 and 150 are slated for eventual underbump metallization and interconnect bump attachment. The opening 145 is patterned over the location of and typically has the same footprint as the dicing street 115. The polyimide film 135 is used as an etch mask against a subsequent etch of the portions of the passivation structure 130 that are exposed by the openings 140 and 150 in the polyimide film 135. Note that edges 155 and 157 of the polyimide film 135 at the opening 145 are substantially vertically aligned with the edges 160 and 165 of the dicing street 115. This alignment between the edges 155 and 157 of the polyimide film 135 and the edges 160 and 165 of the dicing street 115 has ramifications that will be explained below.

Figure 2:
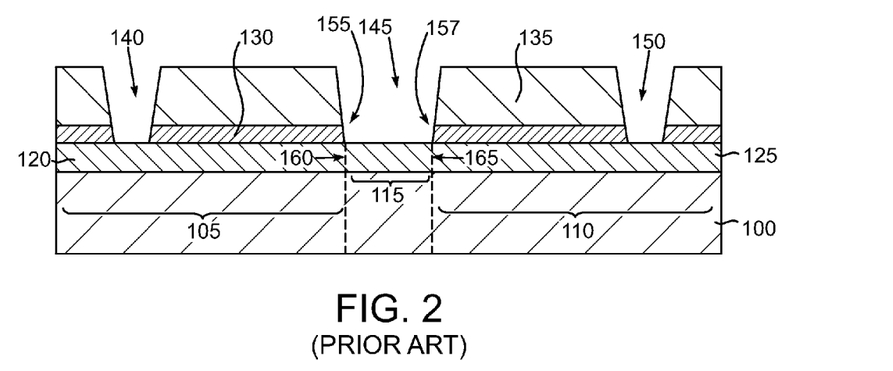
FIG. 2 is a sectional view like FIG. 1 but depicting the etching of a passivation structure using the polyimide film as an etch mask.

Referring now to FIG. 2, a directional etch process is performed to etch through portions of the passivation structure 130 proximate the openings 140, 145 and 150 in the polyimide layer 135. In order to properly serve as an etch mask, the polyimide layer 135 must be approximately coextensive with the chips 105 and 110, i.e., the edges 155 and 157 of the polyimide layer 135 and the edges 160 and 165 of the dicing street 115 are aligned. If this were not the case, then metallization or other aspects of the circuit structures 120 and 125 would be subject to etch attack.

Figure 3:
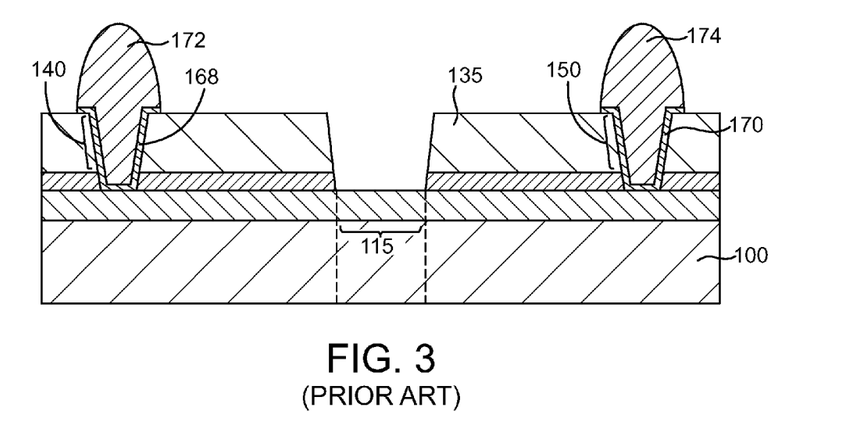
FIG. 3 is a sectional view like FIG. 2 but depicting underbump metallization and bumping processing.

Referring now to FIG. 3, underbump metallization and bumping processes are performed on the silicon wafer 100. Underbump metallization structures 168 and 170 may be fabricated in the openings 140 and 150 of the polyimide layer 135 and then solder bumps 172 and 174 are applied to the underbump metallization structures 168 and 170. At this point, the silicon wafer 100 is ready for singulation at the dicing street 115 (and others like it but not visible).

Figure 4:
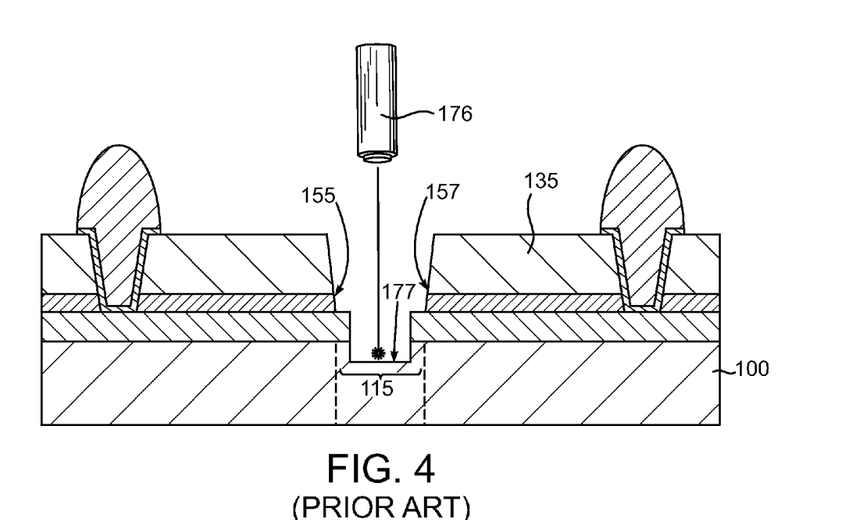
FIG. 4 is a sectional view like FIG. 3 but depicting a laser trench cutting along a dicing street of the semiconductor wafer.
Figure 5:
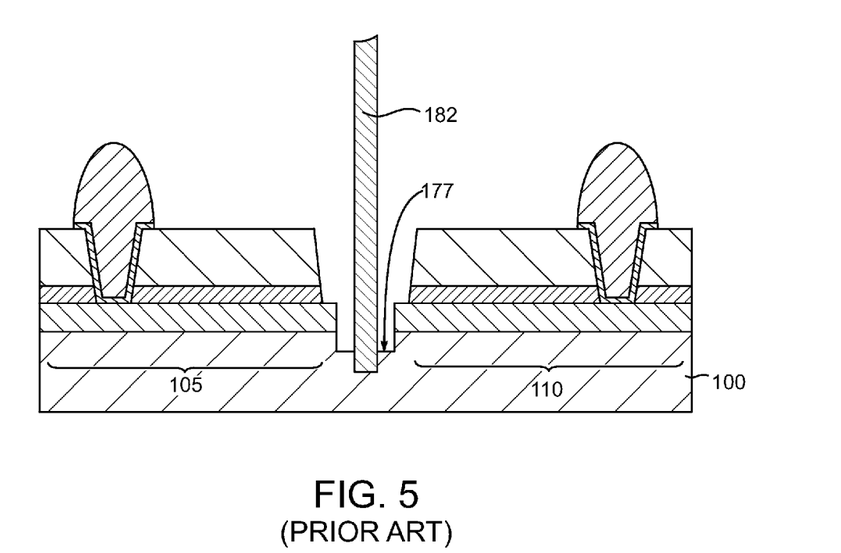
FIG. 5 is a sectional view like FIG. 4 but depicting singulation by mechanical sawing.

In this conventional process, die singulation is a two-step cutting process. In a first step, depicted in FIG. 4, a laser tool 176 is used to cut a trench 177 in the silicon wafer 100 at the location of the dicing street 115. The trench 177 is designed to reduce chipping during a subsequent mechanical sawing step. The trench 177 is cut to depth of about 15 to 30 microns and with a width that is larger than the width of a dicing saw blade (not shown) but smaller than the width of the dicing street 115. Note that, because of the locations of the edges 155 and 157 of the polyimide film 135, there is a potential for the laser tool 176 to burn or otherwise damage the polyimide film 135 proximate the dicing street 115 due to heating effects. A cleaning process using de-ionized water follows the laser trenching. In the second phase of the dicing operation depicted in FIG. 5, a dicing saw 182 is used to singulate the semiconductor chips 105 and 110 by cutting the semiconductor wafer 100 starting at the trench 177 and preceding downward through the remainder of the wafer 100.

Figure 6:
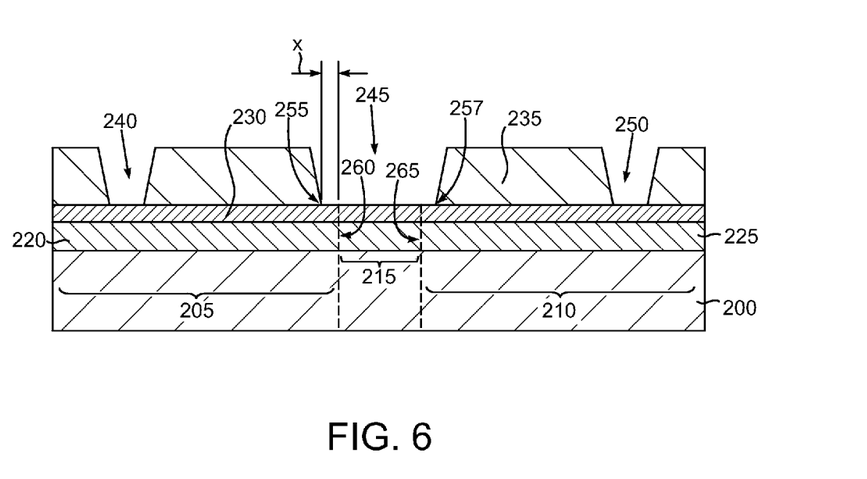
FIG. 6 is a sectional view of a small portion of a semiconductor wafer with a patterned polymer film applied to a passivation structure.

An exemplary method for processing a semiconductor workpiece 200 that eliminates some of the risks of damaging a polymer film, such as a polyimide film, during the dicing process may be understood by referring now to FIGS. 6, 7, 8, 9, 10, 11 and 12 and initially to FIG. 6, which is a sectional view of a small portion of the semiconductor workpiece 200. The semiconductor workpiece 200 may be a wafer or other type of workpiece and may be composed of silicon, germanium, silicon-on-insulator or other substrate materials. The semiconductor workpiece 200 includes multiple semiconductor chips, two of which are visible and labeled 205 and 210, respectively. The semiconductor chips 205 and 210 are separated in one direction by a dicing street 215. The skilled artisan will appreciate that there may be many more dicing streets, some of which completely surround the semiconductor chips 205 and 210. The semiconductor chips 205 and 210 include respective circuit structures 220 and 225, which are schematically represented and may consist of multiple layers of active and passive circuit elements and interconnect layers interspersed with interlevel dielectric layers. A passivation structure 230 overlays the semiconductor chips 205 and 210 and may consist of a single or multiple layers of dielectric materials, such as silicon dioxide and silicon nitride. A polymer layer 235 is formed over the passivation structure 230. The polymer layer 235 may be composed of polyimide, benzocyclobutene or other polymer materials that are used as stress reducing top coats for semiconductor chips. Well-known spin coating or other techniques may be used to apply the polymer layer 235. The polymer layer 235 is initially patterned with openings 240 and 250 that are slated for eventual underbump metallization and solder structure mounting. The opening 245 is formed at the location of the dicing street 215 and may have the same general footprint. However, unlike the conventional design depicted in FIG. 1, in this illustrative embodiment, the patterning is performed so that edges 255 and 257 of opening 245 are set back by a distance x from edges 260 and 265 of the dicing street 215. The value of x may vary depending on the size of the workpiece 200 and prevailing process technologies. In an exemplary embodiment, x may be about 20 to 30 microns. The openings 240, 245 and 250 may be formed in the polymer layer 235 by lithographic patterning using well-known techniques. This may entail, for example, applying the polymer film 235 which contains photoactive compounds and then subsequently masking, exposing and developing the polymer film 235 to establish the openings 240, 245 and 250. Optionally, the openings 240, 245 and 250 may be formed by an etching process in which a suitable mask (not shown) is formed on the polymer film 235 and an etch process is used to cut the openings 240, 245 and 250.

Figure 7:
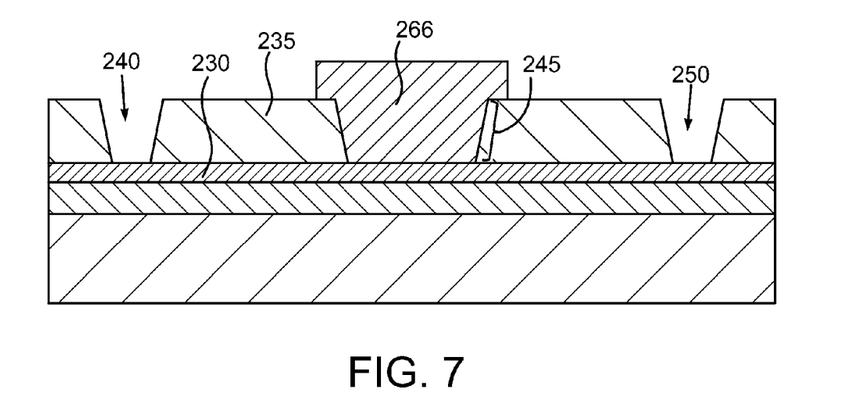
FIG. 7 is a sectional view like FIG. 6 but depicting fabrication of a mask over an opening in the polymer film.
Figure 8:
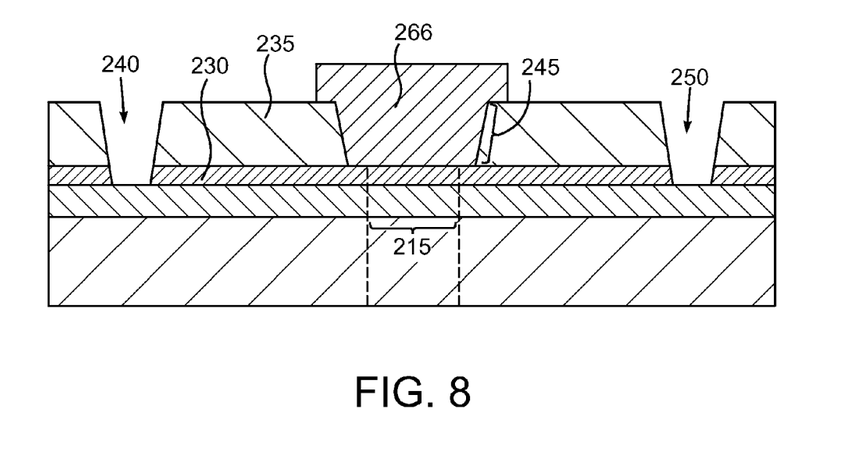
FIG. 8 is a sectional view like FIG. 7 but depicting an etch of the passivation structure.

Next and as shown in FIG. 7, a mask 266 is formed over the opening 245 but not over the openings 240 and 250. A subsequent etch process will be performed using the polymer film 235 as an etch mask in order to etch through the portions of the passivation structure 230 that are located at the openings 240 and 250. However, the mask 266 will protect the portion of the passivation structure 230 positioned proximate the opening 245. The mask 266 may be composed of well-known photoresist materials. Optionally, hard mask materials may be used. Next and as shown in FIG. 8, an etch process is performed to etch the portions of the passivation structure 230 proximate the openings 240 and 250. This etch process is advantageously a directional etch that is preferably directional but need not be purely anisotropic. The etch may be performed by plasma etching with parameters selected to provide a relatively anisotropic etch profile. Exemplary etch chemistries include $CF_4$, $CF_4+O_2$ or $H_2$, $SF_6$ or $NF_3$. Again, this directional etch does not attack the portion of the passivation structure 230 proximate the dicing street 215 and the opening 245.

Figure 9:
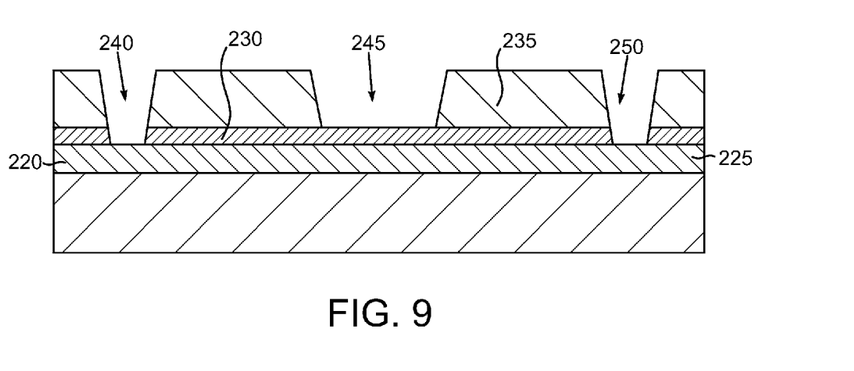
FIG. 9 is a sectional view like FIG. 8 but depicting removal of the mask depicted in FIG. 7.

Next and as shown in FIG. 9, the etch mask 266 depicted in FIG. 8 is removed. This may be accomplished by well-known ashing, solvent stripping or combinations of these. At this stage, the opening 245 is uncovered and the openings 240 and 250 lead to the underlying circuit structures 220 and 225. The semiconductor workpiece 200 is ready for underbump metallization and solder interconnect processing.

Figure 10:
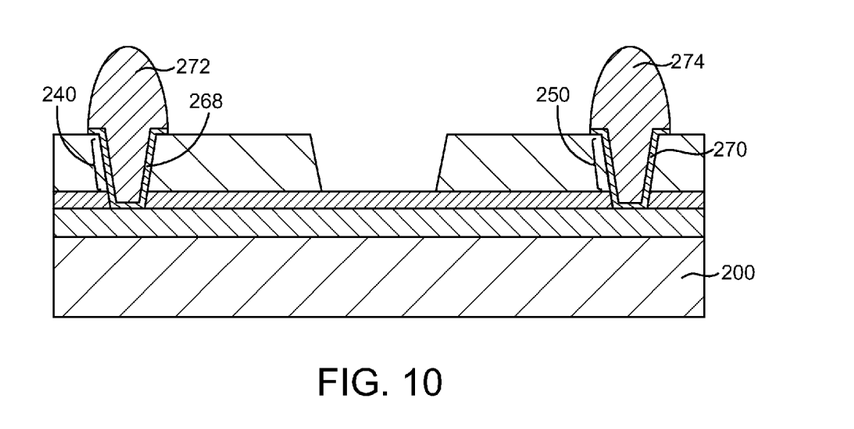
FIG. 10 is a sectional view like FIG. 9 but depicting exemplary underbump metallization and bumping processes.

Referring now to FIG. 10, underbump metallization structures 268 and 270 may be fabricated in the openings 240 and 250 using well-known plating, sputtering or other metal application techniques. The underbump metallization structures 268 and 270 may take on a variety of configurations. Examples include laminates, such as, from bottom up: titanium, copper and nickel or titanium, nickel-vanadium and then copper. Following the UBM application, solder structures 272 and 274 may be applied to the UBM structures 268 and 270. The solder structures 272 and 274 may be solder bumps, conductive pillars composed of copper or other conducting materials or the like, and may be applied by well-known printing, plating or other processes.

Figure 11:
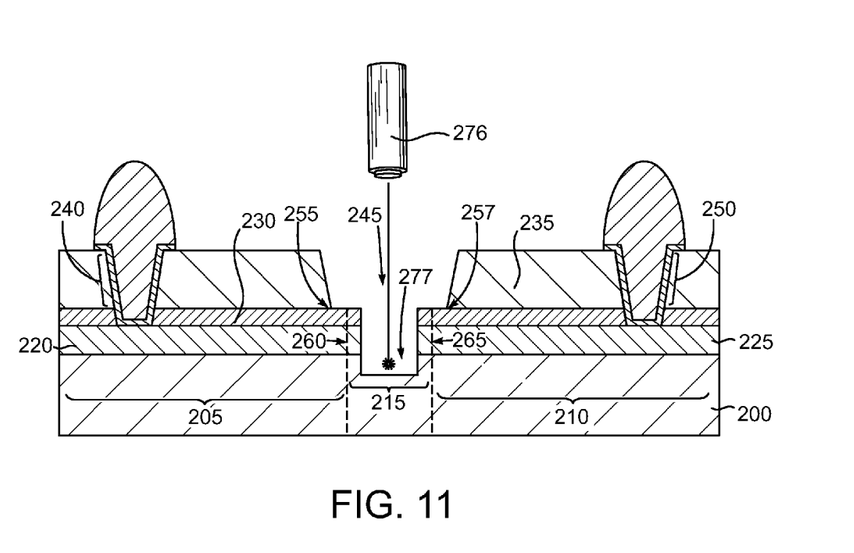
FIG. 11 is a sectional view like FIG. 10 but depicting laser trenching proximate a dicing street of the semiconductor wafer.
Figure 12:
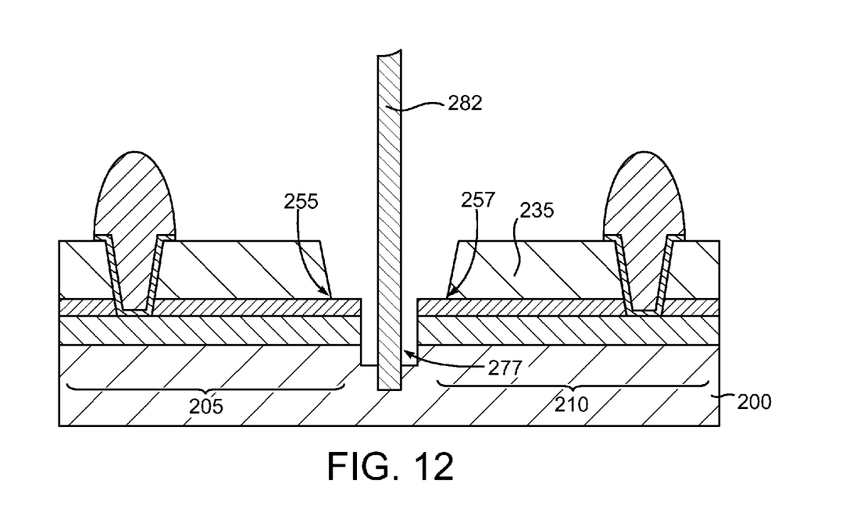
FIG. 12 is a sectional view like FIG. 11 but depicting mechanical dicing.

Next, the semiconductor workpiece 200 may undergo a singulation process to singulate the semiconductor chips 205 and 210. Like the conventional process described above, this may entail a two-step process that begins with a laser cutting process and is followed by a sawing process. As shown in FIG. 11, a laser source 276 may be used to cut a trench 277 in the semiconductor workpiece 200 proximate the dicing street 215. The purpose of the trench 277 is to reduce the potential for the unwanted chipping during a subsequent sawing process. The trench 277 may be cut to depth of about 15 to 30 microns and with a width that is larger than the width of a dicing saw blade (not shown) but smaller than the width of the dicing street 215. Here, the set back of the edges 255 and 257 of the polymer layer 235 relative to the edges 260 and 265 of the dicing street 215 provide an extra cushion against potentially harmful heating effects due to the laser source 276. A cleaning process using, for example, well-known solvent or de-ionized water should follow the laser trenching. Next, and as shown in FIG. 12, a dicing saw 282 may be used to singulate the semiconductor chips 205 and 210. The cutting action proceeds down first through the trench 277 and then into and through the remainder of the semiconductor workpiece 200. Here again, the set back of the edges 255 and 257 of the polymer layer 235 provides additional protection against a potential damage due to the movement and potential miss alignment of the dicing saw 282.

Figure 13:
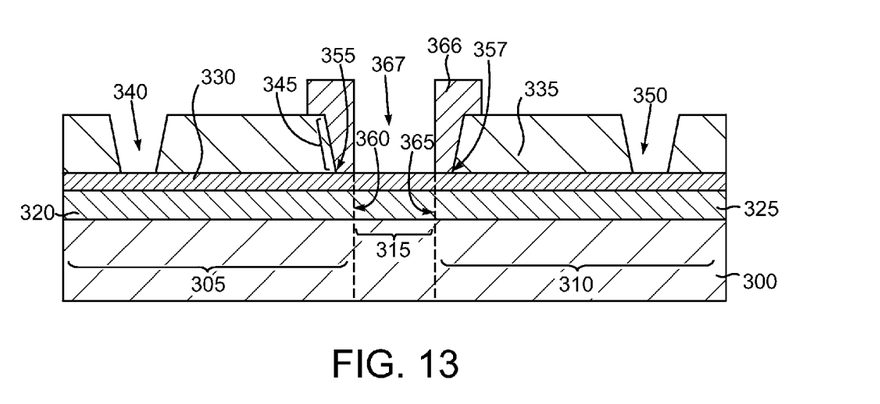
FIG. 13 is a sectional view like FIG. 7 but depicting an alternate exemplary masking of an opening in a polymer film on a semiconductor wafer.

An alternate exemplary process may be understood by referring now to FIGS. 13, 14, 15, 16, 17 and 18 and initially to FIG. 13, which is a sectional view like FIG. 7. Here, a semiconductor workpiece 300 may be structurally the same as the workpiece 200 described elsewhere herein and processed in the same way up to the point depicted in FIG. 7 with a couple of notable exceptions. Thus, the semiconductor workpiece 300 may include multiple semiconductor chips 305 and 310 separated in one direction by a dicing street 315. The semiconductor chips 305 and 310 may include respective circuit structures 320 and 325, which are schematically represented and may consist of multiple layers of active and passive circuit elements and interconnect layers interspersed with interlevel dielectric layers. A passivation structure 330 overlays the semiconductor chips 305 and 310. A polymer layer 335 is applied to the passivation structure 330 and initially patterned with openings 340, 345 and 350. The patterning is performed so that edges 355 and 357 of the opening 345 are set back by the distance x from edges 360 and 365 of the dicing street 315.

Still referring to FIG. 13, an etch mask 366 may be formed over the opening 345 but unlike the mask 266 depicted in FIG. 7, the mask 366 does not fully cover the opening 245. Instead, the mask 366 may be patterned with an opening 367 that is substantially the same footprint, that is, the same width and length as the dicing street 315.

Figure 14:
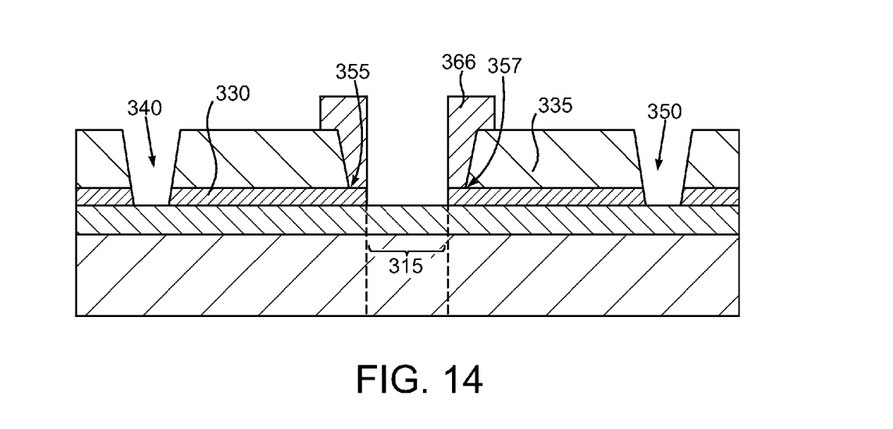
FIG. 14 is a sectional view like FIG. 13 but depicting an etch of an underlying passivation structure.

Next, and as depicted in FIG. 14, an etch process of the type described above in conjunction with FIG. 8 is performed to etch the portions of the passivation structure 330 proximate the openings 340 and 350. The mask 366 protects the passivation structure 330 at the edges 355 and 357 of the polymer film 335 during the etch process. However, the etch is allowed to cut through the otherwise exposed portion of the passivation structure 330 proximate the dicing street 315.

Figure 15:
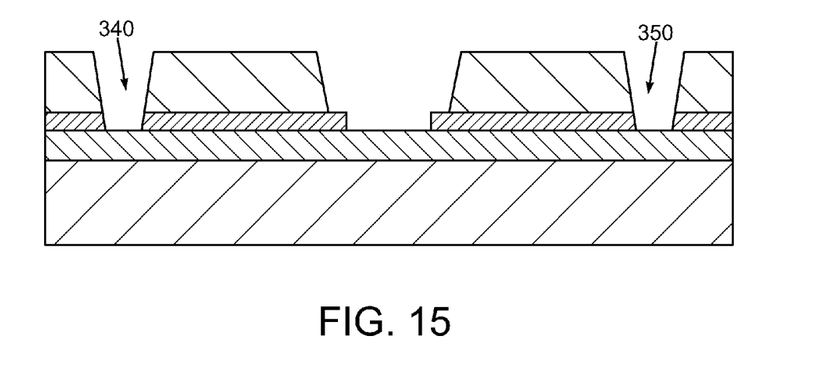
FIG. 15 is a sectional view like FIG. 14 but depicting mask removal.
Figure 16:
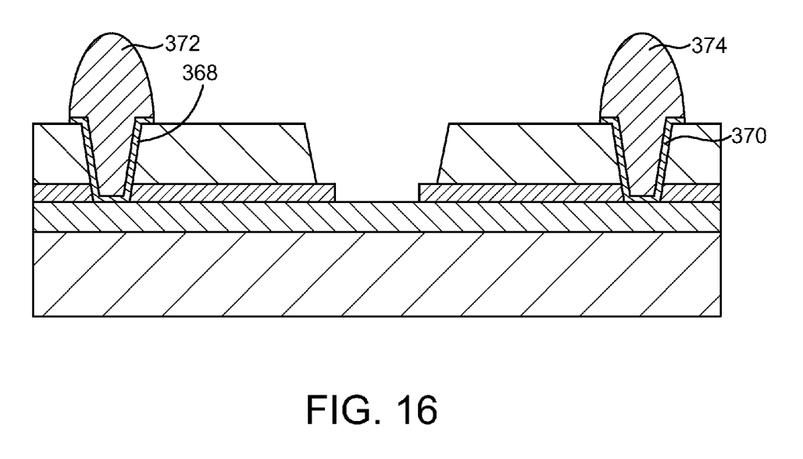
FIG. 16 is a sectional view like FIG. 15 but depicting exemplary underbump metallization and bumping.

Next and as shown in FIG. 15, the mask 366 depicted in FIG. 15 may be removed by ashing, solvent stripping or both. At this stage, the openings 340 and 350 are ready for underbump metallization and solder interconnect processing. As shown in FIG. 16, underbump metallization structures 368 and 370 and interconnect structures 374 and 376 may be fabricated using the techniques described above for the UBM structures 268 and 270 and interconnect structures 274 and 276.

Figure 17:
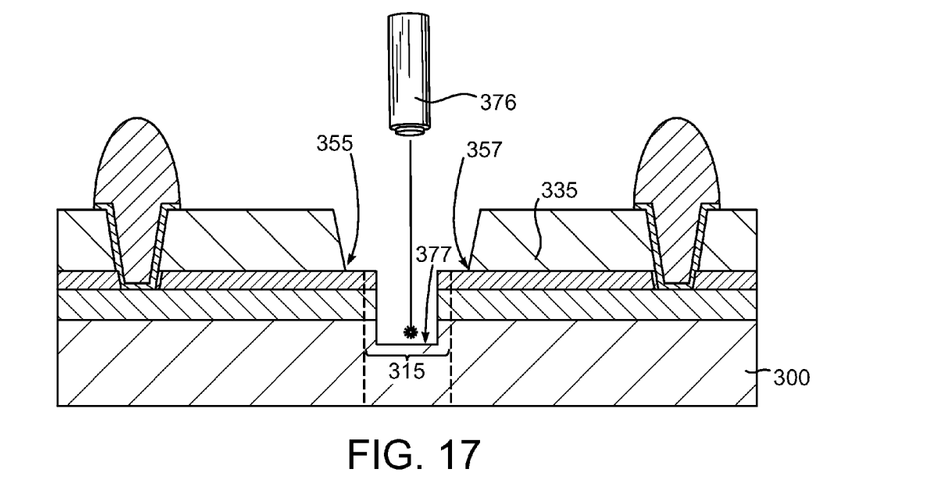
FIG. 17 is a sectional view like FIG. 16 but depicting laser trench etching.
Figure 18:
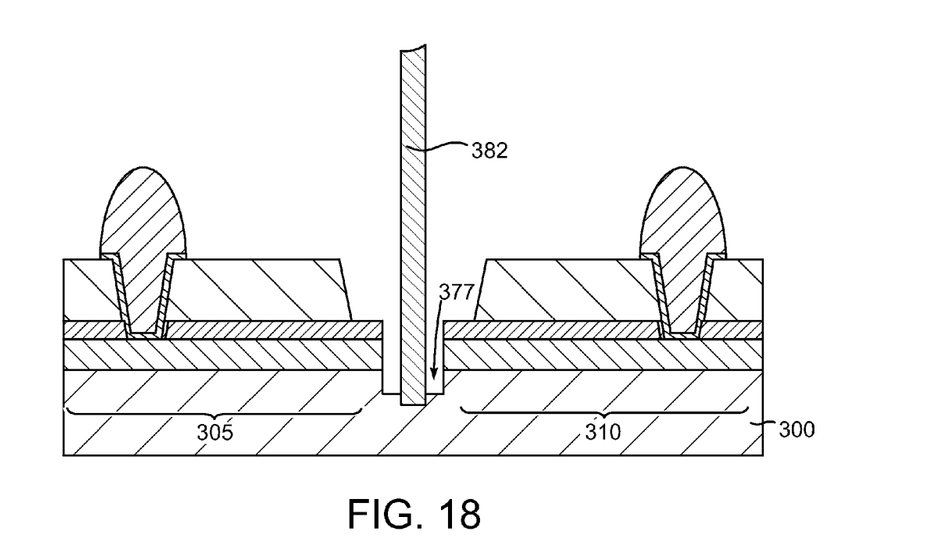
FIG. 18 is a sectional view like FIG. 17 but depicting mechanical dicing of the semiconductor wafer.

Singulation may proceed as a two-step process. As shown in FIG. 17, a laser cutting process using a laser source 376 may be used to cut a trench 377 in the semiconductor workpiece 300. Like the foregoing illustrative embodiment, the set back of the edges 355 and 357 provide protection for the polymer film 335 proximate the dicing street 315 during this laser cutting process. Finally, and as shown in FIG. 18, a dicing saw 382 may be used to singulate the chips 305 and 310 by cutting first through the trench 377 and then subsequently through the semiconductor workpiece 300.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    applying a polymer layer to a passivation structure of a semiconductor workpiece, the semiconductor workpiece having first and second semiconductor chips separated by a dicing street;
    patterning a first opening in the polymer layer with opposing edges pulled back from the dicing street;
    applying a mask over the first opening; and
    etching a first portion of the passivation structure while using the polymer layer as an etch mask.

2. The method of claim 1, comprising laser cutting a trench in the semiconductor workpiece at the dicing street.

3. The method of claim 2, comprising mechanically dicing the first and second chips from the semiconductor workpiece.

4. The method of claim 1, wherein the polymer layer comprises polyimide or benzocyclobutene.

5. The method of claim 1, comprising forming an underbump metallization structure in a second opening in the polymer layer and a solder interconnect structure on the underbump metallization structure.

6. The method of claim 1, wherein the mask comprises a third opening within the first opening, the third opening exposing a second portion of the passivation structure.

7. The method of claim 6, comprising etching the second portion of the passivation structure.

8. A method of manufacturing, comprising:
    applying a polyimide layer to a passivation structure of a silicon wafer, the silicon wafer having first and second semiconductor chips separated by a dicing street;
    patterning a first opening in the polyimide layer with opposing edges pulled back from the dicing street and second opening exposing a first portion of the passivation structure;
    applying a mask over the first opening; and
    etching the first portion of the passivation structure to expose an underlying portion of the silicon wafer while using the polyimide layer as an etch mask.

9. The method of claim 8, comprising laser cutting a trench in the silicon wafer at the dicing street, the trench tracking the layout of the dicing street.

10. The method of claim 9, comprising mechanically dicing the first and second chips from the silicon wafer.

11. The method of claim 8, comprising forming an underbump metallization structure in the second opening in the polymer layer and a solder interconnect structure on the underbump metallization structure.

12. The method of claim 8, wherein the mask comprises a third opening within the first opening, the third opening exposing a second portion of the passivation structure.

13. The method of claim 12, comprising etching the second portion of the passivation structure.

14. The method of claim 5, wherein the solder interconnect structure comprises a solder bump or conductive pillar.

15. The method of claim 1, wherein the polymer layer contains a photoactive compound, the patterning of the first opening comprising exposing and developing the polymer layer.

16. The method of claim 1, wherein the first opening in the polymer layer is patterned by etching.

17. The method of claim 8, wherein the polyimide layer contains a photoactive compound, the patterning of the first opening comprising exposing and developing the polyimide layer.

18. The method of claim 8, wherein the first opening in the polyimide layer is patterned by etching.

19. The method of claim 11, wherein the solder interconnect structure comprises a solder bump or conductive pillar.

* * * * *